United States Patent
Smigelski, Jr. et al.

(10) Patent No.: US 8,269,214 B2
(45) Date of Patent: Sep. 18, 2012

(54) ORGANIC LIGHT EMITTING DEVICE WITH OUTCOUPLING LAYER FOR IMPROVED LIGHT EXTRACTION

(75) Inventors: Paul Michael Smigelski, Jr., Niskayuna, NY (US); Joseph John Shiang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 123 days.

(21) Appl. No.: 12/846,236

(22) Filed: Jul. 29, 2010

(65) Prior Publication Data

US 2012/0025172 A1   Feb. 2, 2012

(51) Int. Cl.
*H01L 51/00* (2006.01)
*H01L 33/00* (2010.01)
*H01J 51/52* (2006.01)

(52) U.S. Cl. .................... 257/40; 257/98; 257/E33.055; 313/498

(58) Field of Classification Search .................... 257/40, 257/79, 98, E51.018, E21.007, 99, E25.02, 257/E33.055; 313/498, 502, 504
See application file for complete search history.

(56) References Cited

U.S. PATENT DOCUMENTS

| | | | |
|---|---|---|---|
| 6,664,137 B2 | 12/2003 | Weaver | |
| 6,777,871 B2 | 8/2004 | Duggal et al. | |
| 7,012,363 B2 | 3/2006 | Weaver et al. | |
| 7,504,770 B2 | 3/2009 | Choong | |
| 2004/0109666 A1 | 6/2004 | Kim, II | |
| 2006/0207647 A1 | 9/2006 | Tsakalakos et al. | |
| 2007/0111368 A1 | 5/2007 | Zhang et al. | |
| 2011/0156577 A1 | 6/2011 | Koyama et al. | |

FOREIGN PATENT DOCUMENTS

| | | |
|---|---|---|
| DE | 102007006348 A1 | 6/2008 |
| EP | 1760800 A2 | 3/2007 |
| WO | 2010032721 A1 | 3/2010 |

OTHER PUBLICATIONS

Ditbacher et al., "Silver Nanowires as Surface Plasmon Resonators", 2005, Physical Review Letters, vol. 95, pp. 257403-1-257403-4.*
A.R. Duggal, "Organic Electroluminescent Devices for Solid State Lighting," Organic Electroluminescence, 2005, p. 437, ed. Z.H. Kafafi, Taylor & Francis Group, Boca Raton, FL.
G. Parthasarathy et al., "Organic Light Emitting Devices, from Displays to Lighting," Interface, 2003, 12, 42, Abstract.
J.J. Shiang et al., Appl. Phys., 2004, 95, 2880, Abstract.
Sun, Y. et al., "Large-Scale Synthesis of Uniform Silver Nanowires Through a Soft, Self-Seeding, Polyol Process,"Advanced Materials, Jun. 5, 2002, pp. 833-837, vol. 14, No. 11.
Sun, Y. et al., "Crystalline Silver Nanowires by Soft Solution Processing," Nano Letters, 2002, pp. 165-168, vol. 2, No. 2.
Kerker, M.J., Colloid Interface Sci., 1985, 105, 297, Abstract.
Dickson et al., "Undirectional Plasmon Propagation in Metallic Nanowires," J. Phys. Chem. B., 2000, pp. 6095-6098, vol. 104.

(Continued)

*Primary Examiner* — A. Sefer
*Assistant Examiner* — Nikolay Yushin
(74) *Attorney, Agent, or Firm* — Mary Louise Stanford

(57) ABSTRACT

An organic light emitting device comprises an outcoupling layer having relatively high aspect ratio nanowires imbedded within an optically thick transparent high optical index film. The incorporation of nanowires increases the optical index of a light emitting assembly and provides a means for extracting light from a light emitting assembly of the organic light emitting device.

19 Claims, 12 Drawing Sheets

OTHER PUBLICATIONS

Sarkar, D. et al., J. Phys. Rev. E., 1997, 56, 1102, Abstract.
Sun, Y. et al., "Uniform Silver Nanowires Synthesis by Reducing AgNO3 with Ethylene Glycol in the Presence of Seeds and Poly(Vin.)," Chem. Mater., 2002, pp. 4736-4745, vol. 14.
Wiley et al., "Polyol Synthesis of Silver Nanoparticles: Use of Chloride and Oxygen to Promote the Formation . . .", Nano Letters, 2004, pp. 1733-1739, vol. 4.
Almeida, M. et al., J. Crystal Growth, 1983, p. 183, vol. 62, Abstract.
Iguchi, M. et al., J. Crystal Growth, 1974, 24/25, 596, Abstract.
Sun, Y. et al., "Polyol Synthesis of Uniform Silver Nanowires: A Plausible Growth Mechanism and the Supporting Evidence," Nano. Lett., pp. 955-960, 2003, vol. 3, No. 7.
Ajayan, P.M. et al., "Quasimelting and Phases of Small Particles," Physical Review Letters, Feb. 15, 1988, pp. 585-587, vol. 60, No. 7.
Marks, L.D., Rep. Prog. Phys., 1994, 57, 603, Abstract.
Clevland, C. et al., J. Chem. Phys., 1991, 94, 7376, Abstract.
Chen, C. et al, "Study on the Synthesis of Silver Nanowires with Adjustable Diameters Through the Polyol Process," Nanotechnology, 2006, pp. 3933-3938, vol. 17.
Smigelski, P. et al., "High Refractive Index Coatings for Advanced Display Films," 2008, GRC02.
Wiley, B. et al., "Polyol Synthesis of Silver Nanostructures: Control of Product . . . ," Langmuir, Aug. 30, 2005, pp. 8077-8080, vol. 21, No. 18.
Korte, K. et al., "Rapid Synthesis of Silver Nanowires Through a CuCl- or CuCl2-Mediated Polyol Process," J. Mater. Chem., 2008, pp. 437-441, vol. 18.
Wiley, B. et al., "Synthesis of Silver Nanostructures with Controlled Shapes and Properties," Accounts of Chemical Research, 2007, pp. 1067-1076, vol. 40, No. 10.
Search Report and Written Opinion from corresponding PCT Application No. PCT/US2011/038276 dated Sep. 13, 2011.

* cited by examiner

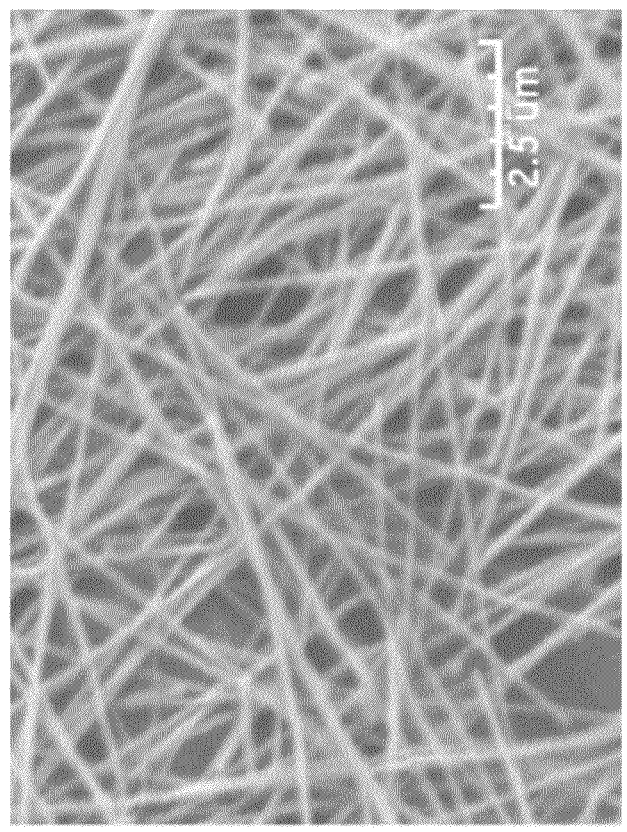
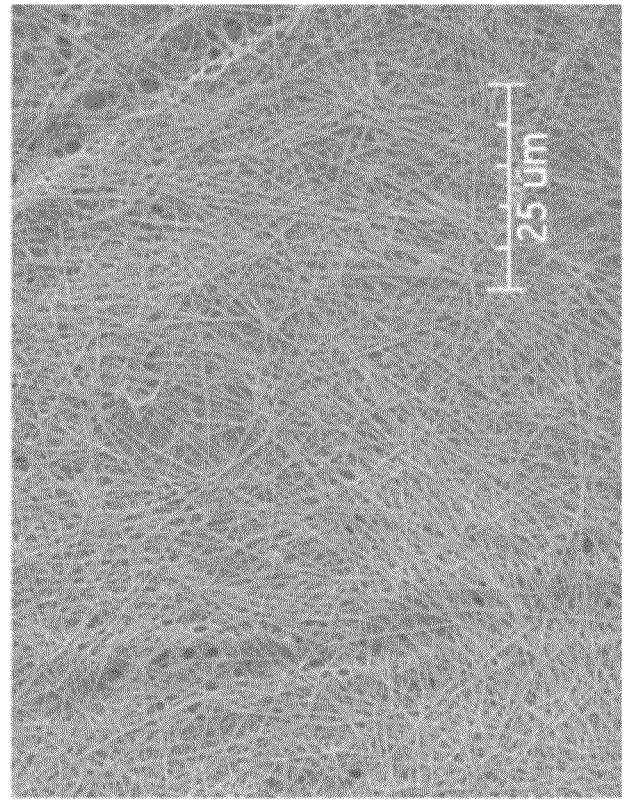
FIG. 9 SEM image of nanowire reaction solution.

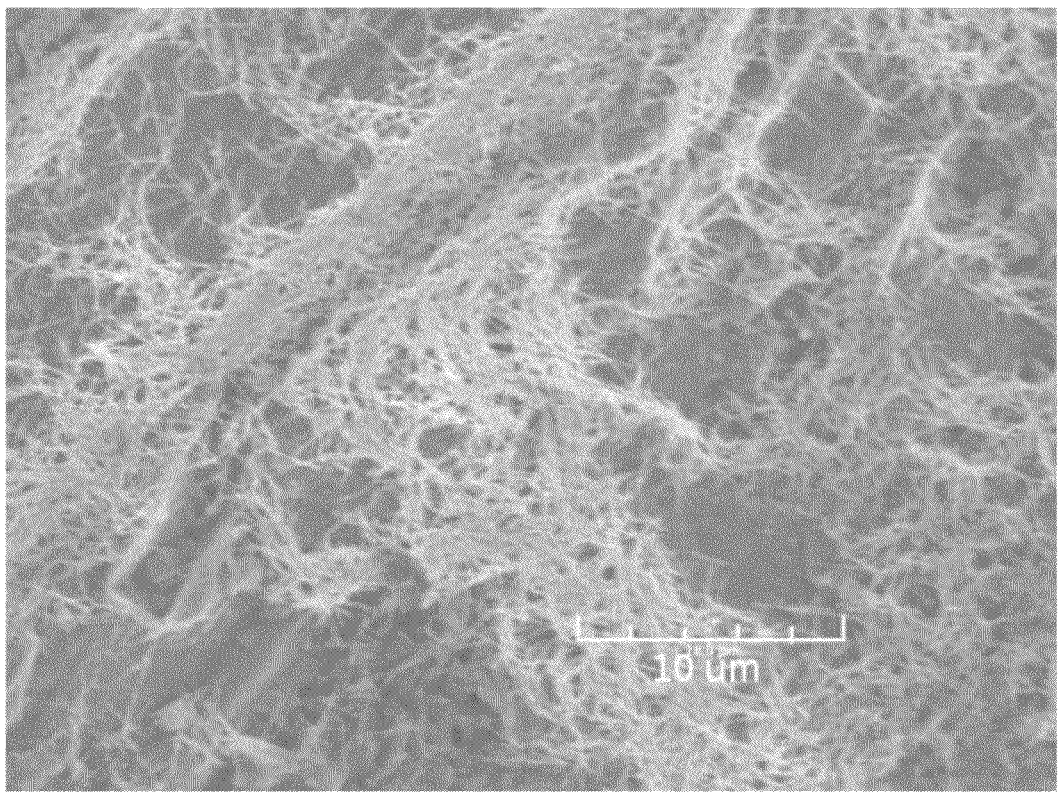
FIG. 10B SEM image of large scale nanowire synthesis.

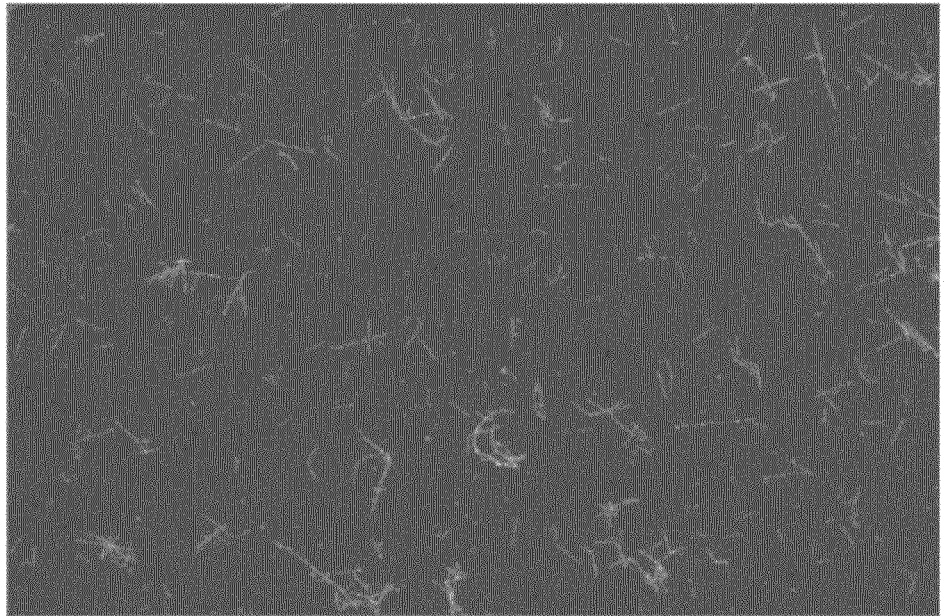
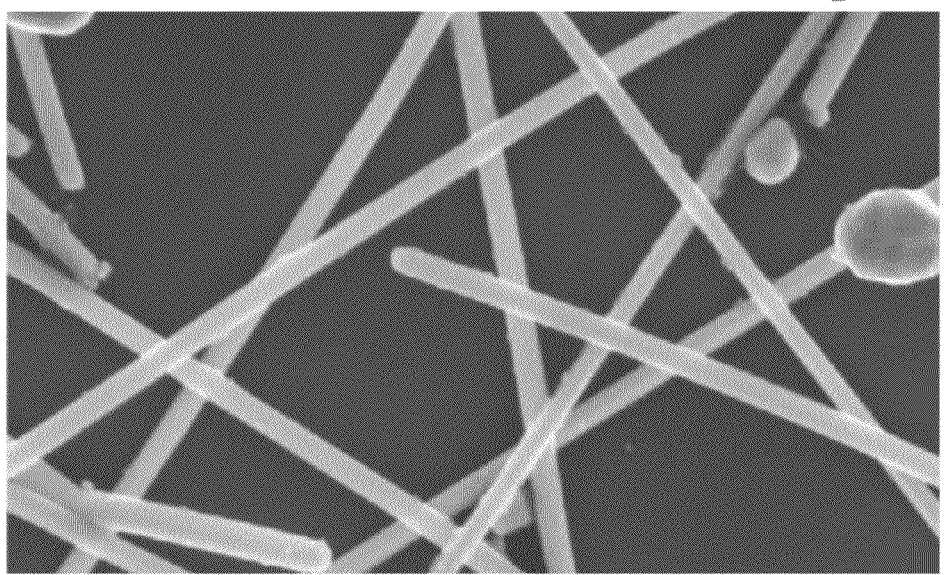
FIG. 11A. SEM images of reaction 5 showing short and long wires.

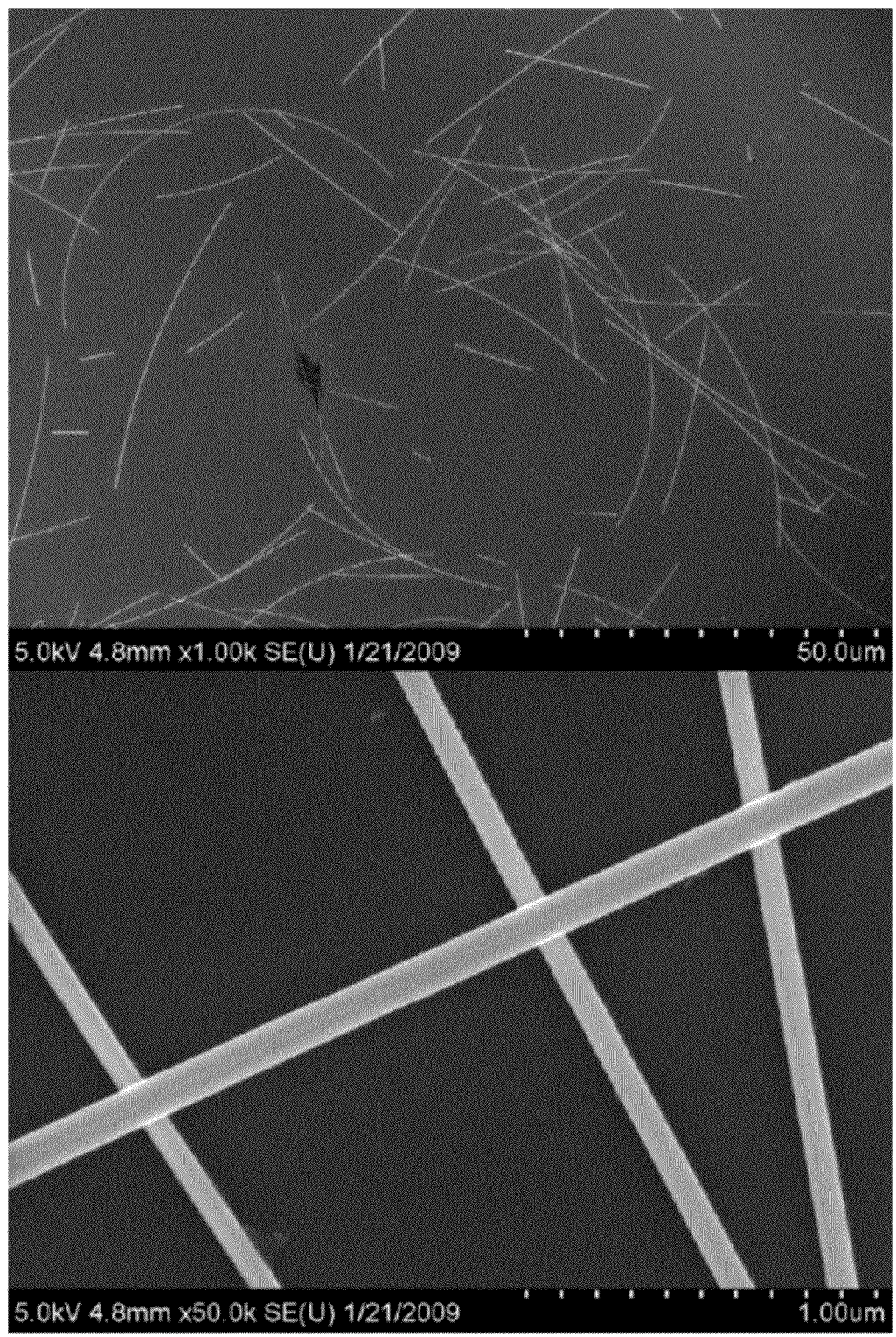
FIG. 11B. SEM images of reaction 9 (bottom) showing short and long wires.

FIG. 13 Optical image of nanowire doped coating.

ORGANIC LIGHT EMITTING DEVICE WITH OUTCOUPLING LAYER FOR IMPROVED LIGHT EXTRACTION

BACKGROUND OF THE INVENTION

Large area illumination sources based upon organic light emitting devices (OLED) have the potential to offer lighting customers a lighting source that provides energy savings and has a unique form factor. The potential energy efficiency gains are predicated on the assumption that the OLED has efficient electron to photon conversion (>0.9), operate at low voltage (<3.5V), exhibit high light extraction efficiencies (>0.7) and can be produced at a low enough cost to satisfy the general lighting market.

The optical performance of OLED devices is fundamentally limited by the difficulties associated with light extraction from large planar surfaces of moderate optical index (n=1.4-2.0) into the ambient. Using simple geometrical arguments, it is possible to show that the fraction of light coupled from an emitter embedded in an material of optical index $n_h$ into a medium of lower optical index $n_1$ is proportional to $(n_1/n_h)^2$. The higher the index of the OLED material, the lower the fraction of light extracted into the ambient (n=1). This single effect can reduce the total amount of light emitted by the OLED by over 50%. An additional complicating factor is that the light emission from an OLED occurs in the optical near field of the metallic electrodes; this leads to a pronounced quenching of the emission and a further reduction in efficiency. While it is possible to construct thicker devices, this tends to lead to power efficiency losses as the active layers of the OLED are increased in thickness. In the absence of corrective techniques, only about 20%-30% of the light generated within the device is actually emitted in to the ambient (n=1).

A number of schemes to increase the light output from OLED devices have been proposed, some involve texturing or patterning one or more interfaces or layers in the OLED to scatter light. Patterning the substrate allows for light that has been trapped in the substrate to be extracted, and increase the total light extraction, but does not affect the amount of light that has been lost due to coupling to the cathode of the device. One possible approach to reduce the losses due to the cathode is to increase the optical index of the substrate that supports the transparent anode material. For example, increasing the optical index of the substrate from n=1.5 to n=1.8 can increase the amount of light coupled into the substrate by a factor of 1.5. The problem then becomes the increased difficulty of extracting this light from the higher index substrate. It is thus necessary to compliment the use of a high index substrate with some degree of light scattering.

U.S. Pat. No. 6,777,871 ("Duggal et al.") discloses an OLED device that includes an output coupler layer that includes a composite layer having a matrix material (e.g., an epoxy, silicone or other polymer materials) that is filled with scattering particles such as titania or zinc oxide. The particles are sized to result in effective scattering of light emitted from the OLED. Duggal et al. discloses an average particle size of 0.1 to 20 microns and preferably 1 to 10 microns. The matrix material may also include nanoparticles, such as titania or zinc oxide, having a size less than 100 nanometers to adjust the index of refraction of the composite outcoupling layer such that it is equal to or close to the index of refraction of the substrate. The output coupler layer is positioned on a transparent substrate, which supports an electrode and a light emitting organic layer.

Although Duggal et al. discloses the use of nanoparticles for light scattering effect, this reference teaches incorporating the nanoparticles in a matrix in conjunction with larger micron-sized particles. Using solely nanoparticles for light scattering effects would require a relatively large weight load of the nanoparticles in the outcouple layer, which would render the layer opaque and brittle.

BRIEF DESCRIPTION OF THE INVENTION

An organic light emitting device comprises an outcoupling layer having relatively high aspect ratio nanowires imbedded within an optically thick transparent high optical index film. The incorporation of nanowires increases the optical index of a light emitting assembly and provides a means for extracting light from a light emitting assembly of the organic light emitting device. The term nanowire as used herein shall include particles that have a length dimension that is greater than a diameter dimension of the nanowire, wherein the diameter is less than one (1) micrometer.

An organic light emitting device comprises a light emitting assembly that includes a first electrode disposed on a substrate, one or more organic light emitting layers disposed on the first electrode and a second electrode disposed on light emitting layer opposite the first electrode. The second electrode is transparent, and an outcoupling layer adjacent to the second electrode opposite the light emitting layer or layers. The outcoupling layer comprises a matrix material such as a resin that is doped with nanowires to increase the optical index of the light emitting assembly and extract light emitted from the light emitting assembly.

According to an aspect of the invention, the first electrode is a cathode and the second electrode is an anode. In addition, a transparent or light transmissive substrate is disposed over the outcoupling layer opposite the second electrode for supporting components of the organic light emitting device. The substrate that is adjacent to the first electrode may be characterized as an encapsulating layer serves as a barrier to ambient elements such as water and oxygen.

In an embodiment the nanowires are composed of silver (Ag) and have an aspect ratio of at least 50/1 (length/diameter), and the silver nanowires are imbedded in a matrix resin material such as a polyacrylate or an epoxy material. In addition, the outcoupling layer may comprise nanowires in an amount of less than 1.0% by weight of the outcoupling layer.

BRIEF DESCRIPTION OF THE DRAWINGS

FIG. 9 is a SEM image of a nanowire reaction solution.

FIG. 10B is a SEM image of a large scale nanowire synthesis.

FIG. 11A includes SEM images of reaction 5 in Table I

FIG. 11B includes SEM images of reaction 9 in Table I.

DETAILED DESCRIPTION OF THE INVENTION

Figure 1:
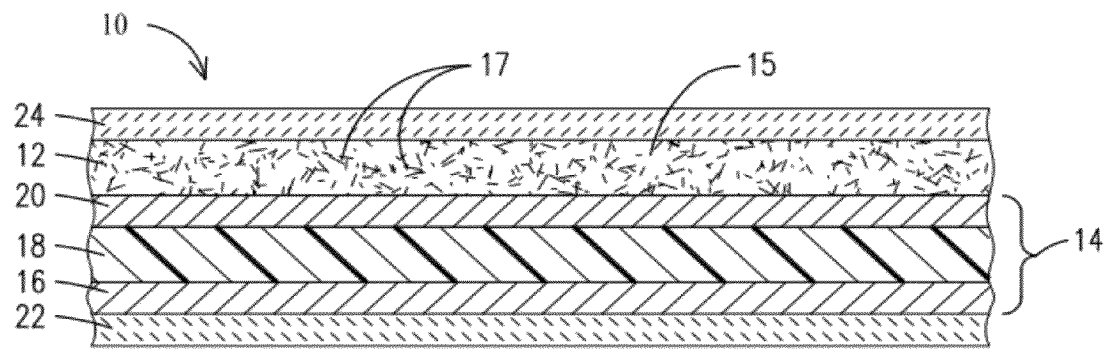
FIG. 1 is a schematic illustration of an organic light emitting device with an outcoupling layer having nanowires imbedded on a matrix.

With respect to FIG. 1 there is schematically illustrated an organic light emitting device 10 that includes an outcoupling layer 12 positioned adjacent to a light emitting assembly 14. The light emitting assembly 14 includes a first electrode 16, which is a cathode, and a second electrode 20, which is an anode. One or more organic light emitting layers 18 are disposed between the first electrode 16 and the second electrode 20, which are both disposed adjacent to the organic light emitting layers 18. The second electrode 20 is transparent for the transmission of light in the form of photon energy generated by the light emitting assembly 14. In an alternate embodiment (not shown) the first electrode may be the anode and the second electrode may be a transparent cathode.

In an embodiment, an encapsulating layer 22 is positioned adjacent to the first electrode to serve as a barrier to ambient elements. The encapsulating layer 22 may comprise a barrier layer, such as $SiO_xN_y$ (where x and y are variable) or $Al_2O_3$. The layer 22 may be a homogenous layer or be a graded structure which alternates between inorganic and organic composition. This encapsulating layer provides a barrier to oxygen and water. The encapsulating layer 22, in conjunction with a sealant (not shown), may also comprise epoxy, a metal, or a glass frit, for example, provides a near hermetic barrier to prevent water and oxygen penetration into the cathode 16, anode 20 and organic light emitting layer 18.

In addition, a transparent substrate 24 is disposed adjacent to the outcoupling layer 12, wherein the outcoupling layer 12 is disposed between the second electrode 20 and the transparent substrate 24. The transparent substrate 24 may be composed of glass, acrylate resins or other transparent materials known to those skilled in the art. The transparent substrate may also include a barrier coating, such as described in Schaepekens and Flanagan (U.S. Pat. No. 7,486,020) to provide further protection against moisture and oxygen ingress.

Electrodes

The anode 20 and cathode 16 inject charge carriers, i.e., holes and electrons, into the organic light emitting layer 18 where they recombine to form excited molecules or excitons which emit light when the molecules or excitons decay. The color of light emitted by the molecules depends on the energy difference between the excited state and the ground state of the molecules or excitons. Typically, the applied voltage is about 3-10 volts but can be up to 30 volts or more, and the external quantum efficiency (photons out/electrons in) is between 0.01% and 30%, but could be up to 40%, 50%, 60%, or more. The organic light emitting layer 18 typically has a thickness of about 50-500 nanometers, and the electrodes 320, 360 each typically have a thickness of about 100-1000 nanometers.

The cathode 16 generally comprises a material having a low work function value such that a relatively small voltage causes emission of electrons from the cathode. The cathode 16 may comprise, for example, calcium or a metal such as gold, indium, manganese, tin, lead, aluminum, silver, magnesium, or a magnesium/silver alloy. Alternatively, the cathode 16 can be made of two layers to enhance electron injection. Examples include a thin inner layer of LiF followed by a thicker outer layer of aluminum or silver, or a thin inner layer of calcium followed by a thicker outer layer of aluminum or silver. A transparent or semi-transparent cathode may be prepared by using very thin metal films so the majority of light incident on the metal film is transmitted.

The anode 20 typically comprises a material having a high work function value. The anode 20 is preferably transparent so that light generated in the organic light emitting layer 18 can propagate out of the organic light emitting device 10. The anode 20 may comprise, for example, indium tin oxide (ITO), tin oxide, nickel, or gold. The first and second electrodes 16, 20 can be formed by conventional vapor deposition techniques, such as evaporation or sputtering, for example.

The Organic Emitting Layer(s)

A variety of organic light emitting layers 18 can be used in conjunction with exemplary embodiments of the invention. According to one embodiment shown in FIG. 1, the organic light emitting layer 18 comprises a single layer. The organic light emitting layer 18 may comprise, for example, a conjugated polymer which is luminescent, a hole-transporting polymer doped with electron transport molecules and a luminescent material, or an inert polymer doped with hole transporting molecules and a luminescent material. The organic light emitting layer 18 may also comprise an amorphous film of luminescent small organic molecules which can be doped with other luminescent molecules.

According to other embodiments of the invention, the organic light emitting layer 18 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 18 can comprise 1-4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments, in which the organic light emitting layer 18 comprises a single layer, as shown in FIG. 1, will now be described. According to one embodiment, the organic light emitting layer 18 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer.

One example of a conjugated polymer which emits light upon application of a voltage is PPV (poly(p-phenylenevinylene)). PPV emits light in the spectral range of about 500-690 nanometers and has good resistance to thermal and stress induced cracking. A suitable PPV film typically has a thickness of about 100-1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer 18 which emits in a desired color range or ranges.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. These layers may be further treated via heating to effect desirable properties, such as resistance to common organic solvents, high heat resistance, longer OLED operating life and higher OLED efficiency.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400.degree. C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene," 10 Adv. Mater. 993-997 (1998). Another preferred blue light emitting polyfluorine is poly(9,9-di-n-hexylfluorine-2,7-diyl) which has a broad double emission peak between about 438 and 460 nm.

According to another embodiment of a single layer device, the organic light emitting layer 18 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis(3-methylsphenyl)-1,1'-biphenyl-4,4'-diamine (TPD) and the luminescent material tris(8-quinolinolato)-aluminum(III) (Alq). TDP has a high hole drift mobility of $10.\text{sup.}{-3}$ $\text{cm.sup.}2/\text{volt-sec}$, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761-763 (1992), which is hereby incorporated by reference.

Figure 2:
FIGS. 2-5 schematically illustrate various examples of organic light emitting layers formed of two or more sublayers.

According to another embodiment of the invention shown in FIG. 2, the organic light emitting layer 18 comprises two sublayers. The first sublayer 30 provides hole transport, electron transport, and luminescent properties and is positioned adjacent the cathode 16. The second sublayer 32 serves as a hole injection sublayer and is positioned adjacent the anode 20. The first sublayer 30 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green) or nile red. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2-1.0 weight percent organic dye.

The second sublayer 32 serves as a hole injection sublayer and may comprise poly(3,4)ethylenedioxythiophene/polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 3269-3281 (1997), which is hereby incorporated by reference.

Figure 3:

According to another embodiment of the invention shown in FIG. 3, the organic light emitting layer 18 includes a first sublayer 34 comprising a luminescent sublayer and a second sublayer 36 comprising a hole transporting sublayer. The hole transporting sublayer 36 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629-631 (1998). The device described therein comprises two polymer layers sandwiched between an ITO electrode and a calcium electrode. The polymer layer next to the ITO is a hole transport layer and comprises a polymeric triphenyldiamine derivative (poly-TPD). The blue emitting polymer layer which is next to the calcium electrode is poly(9,9-dioctylfluorene).

Figure 4:

According to another embodiment of the invention shown in FIG. 4, the organic light emitting layer 18 comprises a first sublayer 38 which includes luminescent and hole transport properties, and a second sublayer 40 which includes electron injection properties. The first sublayer 38 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to .pi.-conjugated polymers, polysilanes are quasi one-dimensional materials with delocalized .sigma.-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly(methylphenylsilane) (PMPS), and poly[-bis(p-butylphenyl)silane] (PBPS). The polysilane sublayer 38 can be applied by spin coating from a toluene solution, for example. The electron injection sublayer 40 may comprise 2,5-bis(4-biphenyl)-1,3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64-70 (1998).

Figure 5:
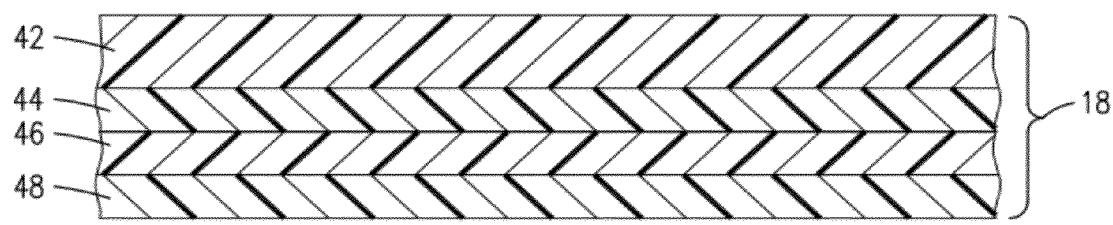

According to another embodiment of the invention shown in FIG. 5, the organic light emitting layer 18 comprises a hole injecting sublayer 42, a hole transporting sublayer 44, a luminescent sublayer 46, and an electron injecting sublayer 48. The hole injecting sublayer 42 and hole transporting sublayer 44 efficiently provide holes to the recombination area. The electron injecting sublayer 48 efficiently provides electrons to the recombination area.

The hole injecting sublayer 42 may comprise a porphyrinic compound, such as a metal free phthalocyanine, a metal containing phthalocyanine, or an organosulfer containing compound for example. The hole transporting sublayer 44 may comprise a hole transporting aromatic tertiary amine, where the latter is a compound containing at least one trivalent nitrogen atom that is bonded only to carbon atoms, at least one of which is a member of an aromatic ring. The luminescent sublayer 46 may comprise, for example, a mixed ligand aluminum chelate emitting in the blue wavelengths, such as bis(R-8-quinolinolato)-phenolato)aluminum(III) chelate where R is a ring substituent of the 8-quinolinolato ring nucleus chosen to block the attachment of more than two 8-quinolinolato ligands to the aluminum atom. The electron injection sublayer 48 may comprise a metal oxinoid charge accepting compound such as a tris-chelate of aluminum.

The above examples of organic light emitting layers 18 can be used to design an organic light emitting device which emits in one or more desired colors. For example, the organic light emitting device 10 can emit ultraviolet, blue, green, or red light.

Outcoupling Layer

The outcoupling layer 12 may comprise a matrix 15, such as a transparent polymeric material, doped with nanowires 17. With respect to FIG. 1, the hashings are provided to represent the nanowires 17 imbedded in the matrix 32. The outcoupling layer 12 can comprise any transparent material, such as polymer or glass, which has a transparency above 80%, preferably above 95%, most preferably above 99%. The matrix 15 may be composed of an acrylate polymer resin (or polyacrylate resins). An example of an acrylate polymer resin is bisPTEA or 1,3-di(thiophenyl)-2-propylacrylate that is doped with the nanowires 17. Another acrylate polymer that may be used is PTEA or phenothioethyl acrylate; however, the invention is not limited to these identified acrylate polymers and may include other transparent resin materials, or any other material having sufficient transparency and compatibility with other components of the organic light emitting device 10. For example, the matrix may comprise planarizing polymer materials such as fluorinated polymers, parylenes, and cyclotenes.

The outcoupling layer 12 can comprise a glass material, such as BK7, F2, SF1 or SF2 glasses available from the Schott Co. These glasses have a refractive index of 1.517, 1.62, 1.72 and 1.65 respectively, for incident light having a wavelength of 589.3 nm. Alternatively, the output coupler may comprise a polymer material. For example, the output coupler may comprise a polycarbonate based material, such as Lexan® 4501 from GE and Ultrason® from BASF Inc. These materials have a refractive index of 1.6 and 1.65, respectively. The output coupler may also comprise a silicone or epoxy, such as the XE5844 silicone available from GE/Toshiba.

The matrix 15 is doped with the nanowires 17 at a concentration of less than about 1% by weight of the nanowires 17, although lower and higher concentrations of the nanowires 17 may be acceptable. For example, the nanowires 17 may comprise up to about 10% by weight of the outcoupling layer 12. Nanowires that were tested, as described in more detail below had an aspect ratio of 100:1 (length:diameter); however, the invention is limited not to nanowires 17 having this specific aspect ratio, which may be smaller or greater, depending in part on the concentration of nanowires in the outcoupling layer 12.

The nanowires 17 may be composed of a material that characteristically is able to extract light to improve light output. For example, the nanowires 17 may be composed of silver or a silver alloy such as $Ag_2O$. Another example of a material that may be used to synthesize nanowires is zinc or a zinc alloy such as $ZnO_3$.

The outcoupling layer 12 including the matrix material 15 doped with nanowires 17 may be applied to the device 10 using techniques and processes that are known to those skilled in the art. The nanowires 17 may be dispersed into a solution of the polymeric matrix material or a dispersion of the matrix material in a carrier liquid and apply the solution or dispersion on the surface of the device, in particular the anode followed by evaporation of the carrier liquid or solvent. The outcoupling layer 12 including the nanowire-doped matrix material may be applied to the device using a number of different techniques such as sputter deposition, spin-coating or chemical vapor deposition.

The thickness of the outcoupling layer 12 may depend in part on the nature of the matrix material used and thickness over the other components of the diode 10. For example, an outcoupling layer comprising an acrylate resin doped with the nanowires may have a thickness ranging from about 5 nm to about 100 microns and preferably is about 100 nm-20 microns thick.

Test Results

A. Preparation of Nanowires

Silver nanowires were prepared using a modified version of the procedure used by Sun and Xia. Adv. Mater. 2002, 34, 833. Ethylene glycol used in all the solutions and as the reaction solvent was fractionally distilled throwing away the leading fraction with a boiling point below 195° C. Silver nitrate solution (0.30 M) in ethylene glycol was prepared and stored in a plastic bottle in the dark. Sodium chloride solution (6.7 mM) in ethylene glycol was prepared and stored in a plastic bottle. Polyvinypyrrolidone (PVP), (mw=55 k or 1M) was dissolved in 5 grams ethylene glycol to which 2 mL of NaCl solution had been added and then the total solution mass adjusted to 8.33 grams. Ethylene glycol (380 mL) was heated to 160° C. in a 250 mL round bottomed flask, sparged with an atmosphere of nitrogen and stirred magnetically.

Once heated, 10 mL of the silver nitrate solution and 5 mL the PVP solution were injected into the flask from separate syringes at a rate of 0.6 mL/min, based on the volume of silver nitrate solution, using a dual-channel syringe pump. Once the injection was complete the syringes were removed from the flask and the reaction left to stir for 1 hour under a blanket of nitrogen. Over the course of the reaction the solution slowly darkened until it became opaque and opalescent. After an hour the reaction was removed from the heat and transferred to a plastic bottle to cool.

Isolation and characterization of the nanowires was achieved by diluting five mL aliquot of the cooled silver solution with acetone causing the silver wires to precipitate. The wires were collected and washed 3 times with isopropanol to remove excess PVP, collecting the wires by centrifugation and decanting the clear supernatant between each wash. The silver wire concentrate was diluted to 2 mL with isopropanol and characterized by UV-visible microscopy and scanning electron microscopy (SEM) as described in more detail below.

The nanowires were then prepared for coating with a hard coat resin, in which a 10 mL portion of the cooled silver solution was centrifuged and the supernatant discarded. The silver wire concentrate was dispersed in isopropanol to make a 2 mL solution.

The hardcoat was prepared by blending equal parts of the monomers bisPTEA and RDX 51027 at 50° C. with gentle shaking. Once fully blended Irgacure 819 photocatalyst (1 wt %) was added and dissolved by continued shaking at 50° C. The silver nanowire dispersion was then added to the blend (10% v/w). The nanowires were dispersed in the viscous blend by gentle mixing with a spatula and the resin was degassed under vacuum to remove the residual iso-propanol and any air bubbles.

Preparation of Samples by Molding

Substrates of either 1"×1" glass or plastic squares were rinsed with isopropanol and dried under a stream of nitrogen. Acrylate resin doped with silver nanowires was added to one side of the substrate and compression molded against a silicone mold. The resin was then cured using a Xenon flash photolysis apparatus. The lamps were set at the minimum height and the sample cured using three 10-second exposures allowing the sample to cool between exposures. The substrate and cured resin coating was then released from silicone mold. Blue emissive fluorescent polymer was then applied to the coated side of the substrate by spin-coating a 1% solution in toluene at 300 rpm for 30 seconds.

Preparation of Large Samples by Lamination

Plastic substrates (7"×7") were cleaned with a static roller. A bead of approximately 1 mL of resin was deposited along one edge of the plastic. The plastic square was then aligned with a 6"×6" silicone mold and affixed with adhesive tape. Passage of the article through a laminator gave a uniform coating deposited between the substrate and mold. The mold was then transferred to a belt driven fusion UV-cure line. The mold was passed under the lamps three to five times and then let cool. Once cooled the substrate with coating was released from the mold and passed under the lamps twice more with the resin side facing the lamps. Excess resin and uncoated substrate were trimmed away to provide an article approximately 5"×5". Small samples were then cut as needed and coated with either fluorescent resin or indium tin oxide (ITO).

Figure 6:
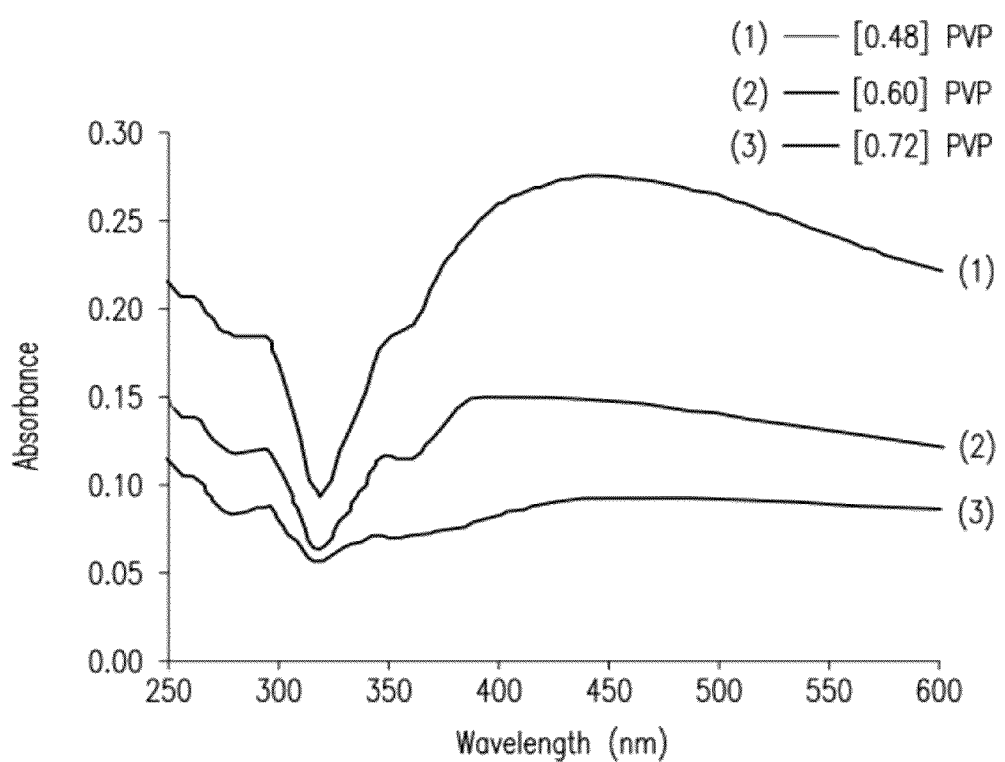
FIG. 6 is a light absorption graph illustrating the effect of PVP concentration on absorption spectrum.

Initial attempts to reproduce the preparation of silver nanowires as described by Sun and Xia met with limited success, producing only solutions containing nanoparticles or nanorods when a 0.60 M polyvinylpyrrolidone (PVP) injection solution was used. Reactions at this concentration of PVP gave a broad absorption maximum centered at 409 nm and extending to down to 385 nm rather than the distinct peak around 380 nm characteristic of a pure nanowire solution. It is known that the ratio of the surfactant polymer polyvinylpyrrolidone (PVP) to silver nitrate is critical to attaining selective nanowire growth. Optimizing the synthesis by changing the PVP/Ag ratio failed to give selective nanowire formation. These reactions never achieved the opalescence indicative of a nanowire solution nor did the UV/Visible spectrum from these reactions show the expected plasmon absorption band at 380-400 nm as shown FIG. 6. The measured absorption maximum near 430 nm was more indicative of nanoparticles and nanorods. The lower PVP concentration reactions also produced a large amount of agglomerated silver.

Figure 7A:
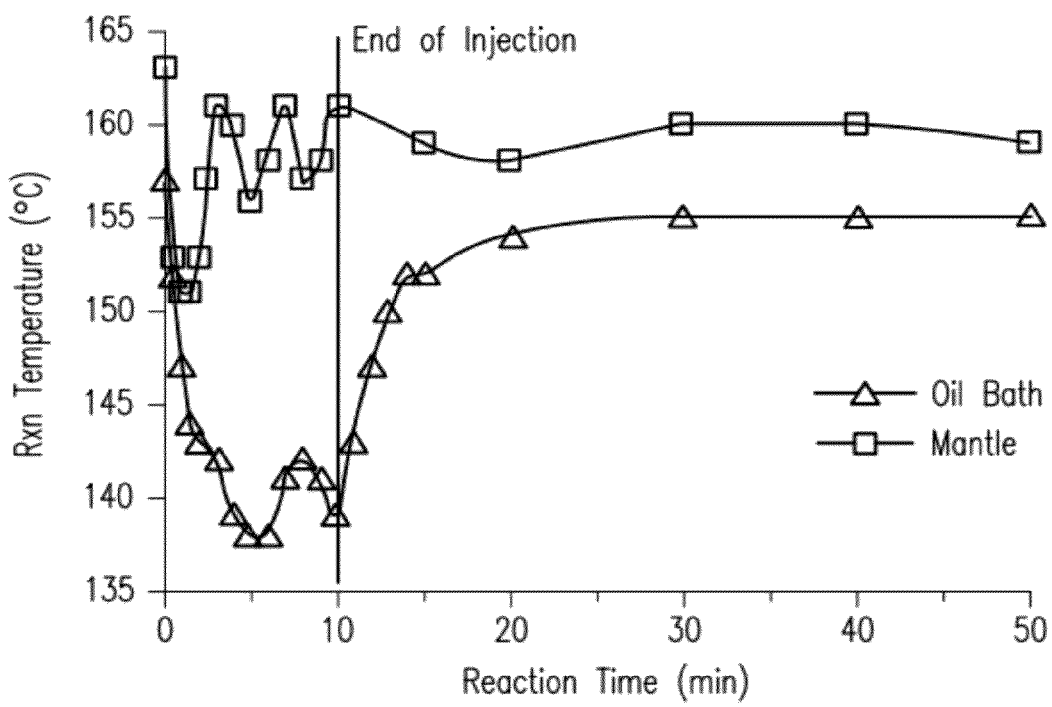
FIG. 7A is a light absorption graph illustrating the effect of the type of heat source on process temperature.
Figure 7B:
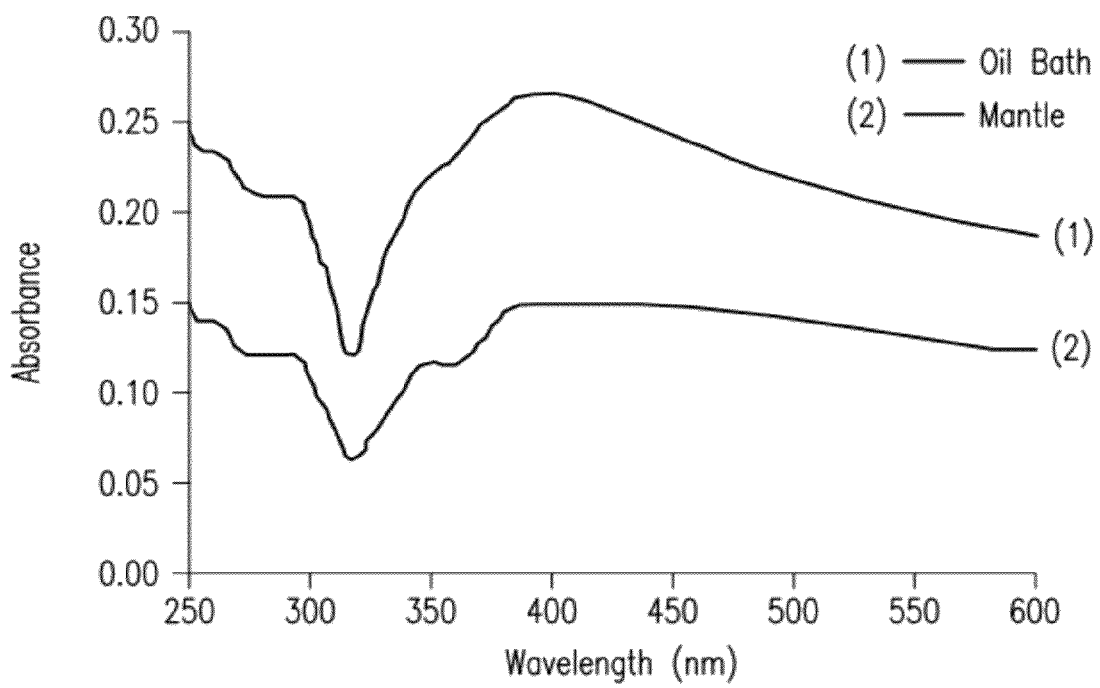
FIG. 7B is a light absorption graph illustrating the effect of the type of heat source on the absorption spectrum.

Evaluation of temperature as a variable over a range of temperatures from 145 to 160° C. led to no appreciable change in morphology. However, when the heating mantle was switched to an oil bath as the heat source a significant improvement in nanowire selectivity was observed. The plasmon absorption had a clear maximum at 390 nm as shown in FIG. 7B. During the initial injection phase of the reaction the addition of the ambient temperature solutions of AgNO3 and PVP to an equal volume of preheated ethylene glycol caused a rapid temperature drop. As shown in FIG. 7A, for the reactions where the temperature of the reaction was controlled using a mantle heater and the thermocouple placed in the flask there was a ten-degree drop in temperature followed by a quick recovery. Also in reference to FIG. 7A, the reactions where the flask and thermocouple were immersed in the oil bath the reaction temperature had a twenty-degree temperature drop and did not recover until after the injection was complete.

A more controlled system was then focused on only three variables, PVP concentration, PVP molecular weight, and NaCl concentration. By running all reactions under an atmosphere of either argon or nitrogen, the contribution of oxygen was reduced to any etching processes alleviating the need for iron or copper salts. Sodium Chloride (NaCl) was selected as a "seed" salt because it was reasoned the NaCl would be insensitive to oxygen in stock solutions and therefore stable over the course of the investigation. Interestingly the apparent amount of NaCl necessary for wire formation described in the literature was only 0.06 mM or approximately 3.2 ppm. It was determined that that laboratory glassware could easily supply sufficient sodium to make controlling the amount of sodium in the reaction difficult. All glassware and stir bars were acid washed with 0.1 M nitric acid and rinsed with deionized water. In addition, ethylene glycol was distilled to remove trace amounts of ionic contaminates and store the freshly distilled ethylene glycol and the glycol solutions in plastic bottles previously rinsed with deionized water. Fractional distillation of ethylene glycol gave a low boiling cut that came over from 190-194° C. This cut was discarded and the fraction boiling at 195° C. was retained for our experiments.

Figure 8:
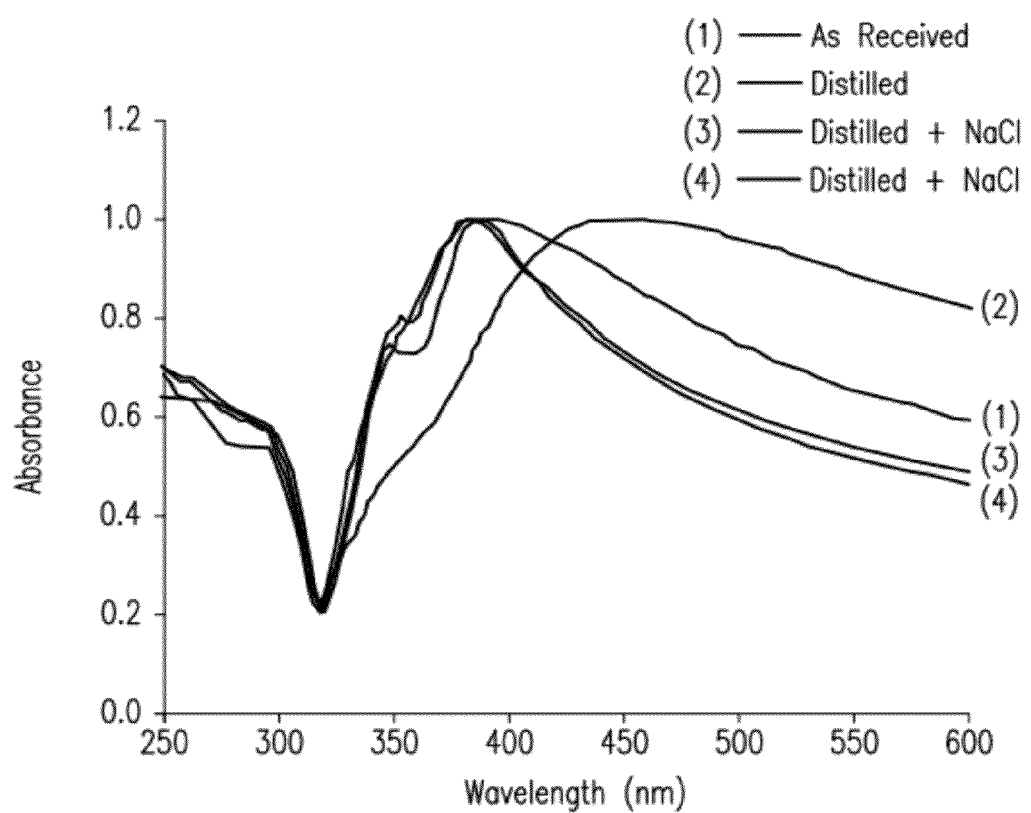
FIG. 8 is a graph illustrating the effects of distillation and salt on the absorption spectrum.

As shown in FIG. 8 the plasmon absorption spectrum illustrates that the reaction using distilled ethylene glycol failed to give a significant amount of nanowires. Adding NaCl (0.2 mM) in the PVP solution caused a significant shift in the peak maximum from 445 nm for the freshly distilled ethylene glycol to 385 nm for the reaction with added NaCl. Repeating these conditions gave an identical absorption spectrum. A drop of the reaction solution was deposited on a metal stud and analyzed by SEM. The image of FIG. 9 shows substantially pure nanowires that were approximately 20 µm long and 200 nm in diameter giving an aspect ratio of about 100:1.

Attempts at further optimizing the synthesis by balancing the NaCl and PVP concentrations resulted in a new optimal set of conditions. It was found that reducing the PVP concentration by 63% (0.38 M) while increasing the NaCl concentration (0.3 mM) gave the sharpest plasmon absorption spectrum. These conditions were then used for scaling up the synthesis by a factor of ten in terms of the amount of AgNO$_3$. The concentration of the injection solution was increased to reduce the injected volume and compensating by increasing the volume of preheated reaction solution. The optimum conditions for the large-scale reaction were only slightly different from what we had found for the small-scale reactions. An aliquot of the reaction solution was deposited on a metal stud and analyzed by SEM.

Figure 10A:
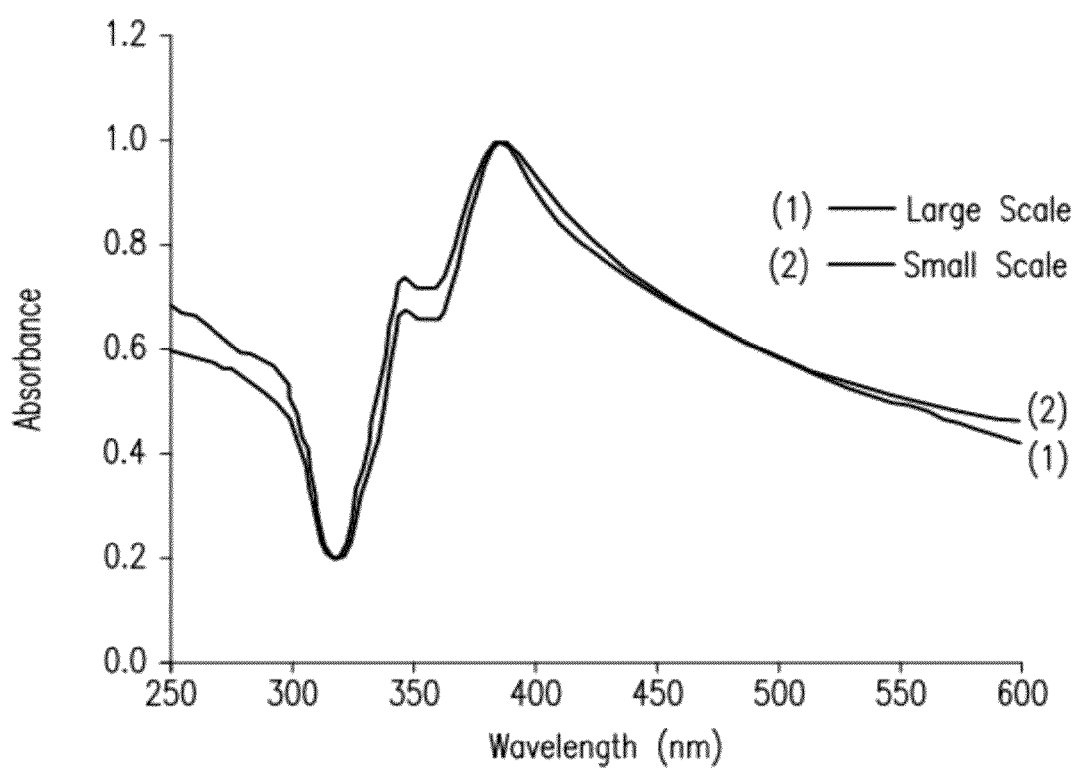
FIG. 10A is a graph illustrating the absorption spectrum of a large scale nanowire synthesis.

The absorption spectrum was nearly identical to that of the small-scale reaction as shown in FIG. 10A. In reference to the SEM image of FIG. 10B, the majority of the sample was composed of short thin nanowires measuring about 80 nm in diameter and 5 µm long with small amounts of large particles. Surprisingly, the new batch of wires was significantly thinner than the previous batches yet this was not reflected in a shift in the maximum absorbance to shorter wavelengths.

Larger scale reactions were conducted in an attempt to achieve longer wires looking at the concentrations of PVP, NaCl and the molecular weight of the PVP. Twelve of the reactions gave significant quantities of nanowires as determined by their absorption spectrum, ten of which were analyzed by SEM for length and diameter. The average wire diameter varied between 70 to 108 nm while the length spanned 5 to 20 microns as set forth in Table I below. A plot of the length versus width of the nanowires showed a correlation although it was not linear.

TABLE I

Size Analysis of Nanowires with Variations of [PVP], [NaCl] and PVP Molecular Weight

| Reaction | Polyvinyl-pyrrolidone Mw (kDaltons) | [PVP] (M) | [NaCl] (mM) | Radius of nanowires (nm) | st. dev. | Length of nanowires (µm) | st. dev. |
| --- | --- | --- | --- | --- | --- | --- | --- |
| 1 | 55 | 2.2 | 1.4 | 90 | 40 | 7 | 3.7 |
| 2 | 55 | 2.2 | 1.6 | 79 | 34 | 6 | 4.3 |
| 3 | 55 | 2.3 | 1.5 | 81 | 9 | 7 | 4.0 |
| 4 | 55 | 2.4 | 1.4 | 106 | 38 | 32 | 6.6 |
| 5 | 55 | 2.4 | 1.6 | 73 | 32 | 3 | 1.6 |
| 6 | 1000 | 2.2 | 1.4 | 74 | 10 | 6 | 2.9 |
| 7 | 1000 | 2.2 | 1.6 | 72 | 32 | 6 | 3.9 |
| 8 | 1000 | 2.3 | 1.5 | 97 | 21 | 7 | 7.1 |
| 9 | 1000 | 2.4 | 1.4 | 108 | 30 | 19 | 30.8 |
| 10 | 1000 | 2.4 | 1.6 | 105 | 23 | 10 | 10.3 |

Analysis of the data using Design-Expert® software showed that the concentration of PVP and NaCl both were playing a role in determining the length of the wires whereas only the concentration of PVP affected the wire width. The molecular weight of the PVP had no effect on the width of the wires in the region tested as set forth in the below Equations 1 and 2.

$$(\text{length})^{-2.4} = 1.8 \times 10^{-9} *[\text{PVP}] - 6.7 \times 10^{-9} *[\text{NaCl}] + 3.3 \times 10^{-9} *[\text{PVP}] *[\text{NaCl}] \quad \text{Eq. 1}$$

$$\text{width} = -169 + 114 *[\text{PVP}] \quad \text{Eq. 2}$$

According to the analysis the NaCl concentration was further decreased and the PVP concentration was increased to achieve longer wires. This is in agreement with the SEM analysis that showed large particles typical of a deficiency in PVP. Good quality nanowires were observed as shown in FIGS. 11A and 11B, which includes images of nanowires according to reactions 5 and 9 respectively from Table I above. These nanowires then were processed into light scattering films.

Silver nanowires isolated in the usual way were redispersed in 2 mL of iso-propanol and blended into acrylate solutions to give formulations containing approximately 400 ppm silver. The refractive index of the coating was determined to be 1.65. Simplified device structures were constructed to evaluate the efficacy of the nanowire production technique. The test structure contained only a transparent substrate, the scattering layer and a layer of fluorescent polymer. Small samples were prepared by depositing the nanowire-doped resin onto a cleaned substrate and compression molding to the desired thickness. The surface of the mold imparts roughness onto the acrylate coating surface characteristic of how the mold itself was made. In addition, the nanowire doped resin was also deposited on substrates by spin-coating.

Characterization of the coating surfaces by atomic force microscopy showed that silicone molds made using silicon wafers provided acrylate coatings with a roughness comparable to control coatings prepared by spin-coating the acrylate. Coatings prepared using polished glass molds were significantly rougher than either silicone molded or spin-coated samples as shown in Table II below.

TABLE II

| Sample Roughness Values | | |
|---|---|---|
| Silicon Molding | Spin-Coating | Glass Molding |
| Image Rq 0.310 nm | Image Rq 0.334 nm | Image Rq 2.27 nm |
| Image Ra 0.245 nm | Image Ra 0.263 nm | Image Ra 1.47 nm |

Figure 12:
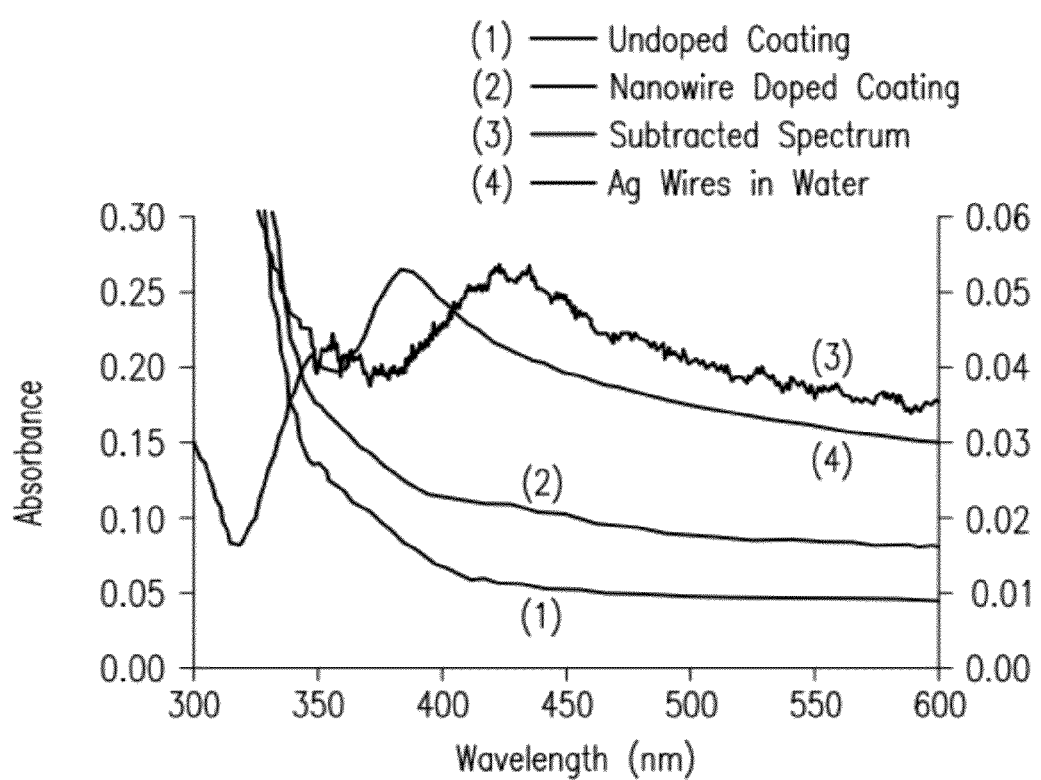
FIG. 12 is an absorption spectrum graph with absorbance of the control coated glass on the left axis and the absorbance of the nanowire doped coatings on the right axis.

The samples were analyzed under UV-visible microscopy including an undoped acrylate resin sample and silver nanowires in water. The UV-visible microscopy testing showed a decrease in transmitted light, which was expected. By subtracting the spectrum of the undoped sample we find the plasmon absorption spectrum characteristic of silver nanowires, which is shown in FIG. 12. The shift in wavelength maximum is due primarily to a change in the refractive index of the medium of the sample although aggregation of the wires cannot be ruled out.

Figure 13:
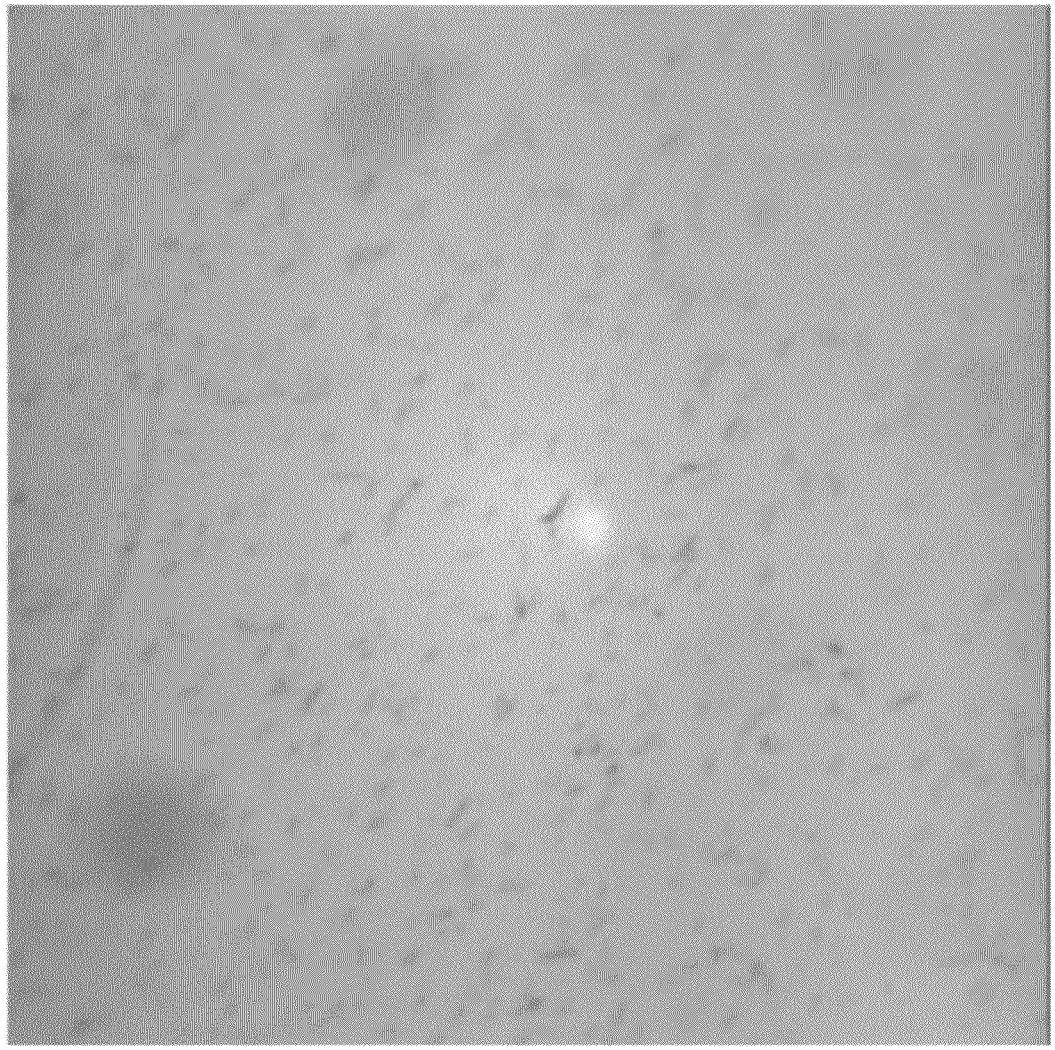
FIG. 13 is an optical image of a nanowire doped coating.

The nanowire-doped samples were also examined using optical microscopy. While the wires have nanometer scale in one dimension they are tens of microns in length rendering them visible under non-polarized light. In the image provided in FIG. 13, there is shown wires on the order of 0.5 mm long roughly 25 times the average size found in the SEM analysis. Agglomeration of the wires into bundles could account for the apparent size discrepancy between the two methods.

Samples made using silicone molding were further coated with blue emissive fluorescent polymer, which provided samples suitable for fluorimetry. Suitable blue emissive polymers may be obtained from Sumation Chemical Company or be one of the polyflorene materials that are available from American Dye Source. High refractive index substrates such as polyethylene napthalate (PEN) and polyethylene tetrapthalate (PET) were considered because such substrates should more strongly couple to the emissive polymer layers and further enhance the light output. Accordingly, PET and PEN substrates were coated with the nanowire-doped resin, and compared to the blue emissive polymer coated sample and a glass substrate coated sample. It was found that that PEN strongly absorbed light out to 400 nm, much longer than the glass or PET based samples in which the acrylate coating began strongly absorbing at 350 nm. For this reason, 410 nm excitation in our experiments was used.

Figure 14:
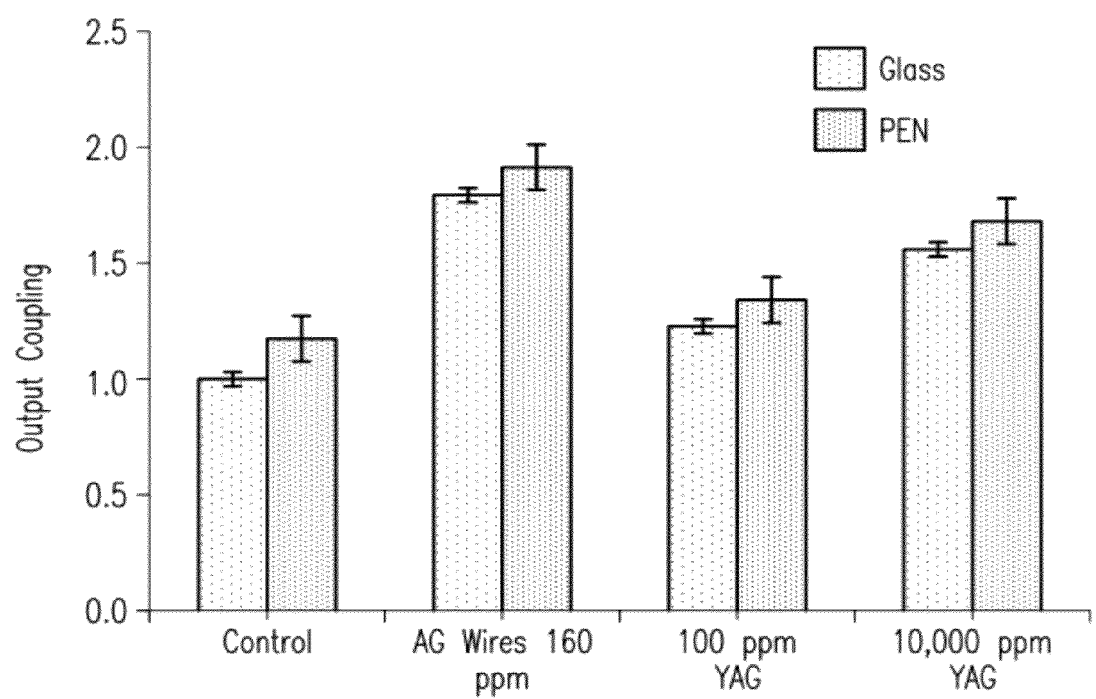
FIG. 14 is a bar graph comparing nanowire light output relative to a glass control and to YAG particle control light output.

Fluorescence from the test samples was compared to a control glass slide coated with acrylate without nanowire doping. The fluorescence intensity was corrected to account for variations in the optical density of the blue emissive polymer layer. The ratio of fluorescence intensity between the test samples and the glass control is the outputcoupling factor. In addition, control samples containing two levels of YAG particles were run for comparison. As shown in FIG. 14, the silver nanowire doped samples directed 1.8 times as much light out of the device compared to samples containing no wires.

While certain embodiments of the present invention have been shown and described herein, such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. An organic light emitting diode, comprising: a first electrode that is a cathode and a second electrode that is an anode; an organic light emitting layer disposed between the first electrode and second electrode; and an outcoupling layer that is disposed on the second electrode opposite the light emitting layer and comprises an inorganic material or organic polymer material that is doped with nonmetal nanowires which scatter light emitted from the organic light emitting layer without altering wavelengths of the light to increase a light output of the organic light emitting diode.

2. The organic light emitting diode of claim 1 wherein the nonmetal nanowires have a length:diameter aspect ratio of at least 50:1.

3. The organic light emitting diode of claim 1 wherein the nonmetal nanowires have a length:diameter aspect ratio of at least 100:1.

4. The organic light emitting diode of claim 1 wherein the outcoupling layer is coated with a fluorescent polymer.

5. The organic light emitting diode of claim 1 wherein the outcoupling layer comprises 100 ppm to 200 ppm of the nonmetal nanowires.

6. The organic light emitting diode of claim 5 wherein the outcoupling layer comprises about 160 ppm of the nonmetal nanowires.

7. The organic light emitting diode of claim 1 wherein the nonmetal nanowires are composed of a silver alloy.

8. The organic light emitting diode of claim 1 wherein the nonmetal nanowires are composed of silver nitrate.

9. The organic light emitting diode of claim 1 wherein the nonmetal nanowires are composed of a zinc alloy.

10. The organic light emitting diode of claim 1 wherein the nonmetal nanowires comprise up to about 10% by weight of the outcoupling layer.

11. The organic light emitting diode of claim 1 wherein the nonmetal nanowires comprise up to about 1% by weight of the outcoupling layer.

12. The organic light emitting diode of claim 10 wherein the outcoupling layer has a thickness of about 5 nm to about 100 microns.

13. An organic light emitting diode, comprising: an organic light emitting assembly that includes a first electrode that is a cathode, a second electrode that is an anode and one or more organic light emitting layers disposed between the first electrode and second electrode; and an outcoupling layer that is disposed on the anode opposite the one or more light emitting layers comprising a glass or polymeric material that is doped with nonmetal nanowires that have a length:diameter ratio that ranges from about 50:1 to about 200:1 to scatter light emitted from the organic light emitting layer without altering wavelengths of the light and to enhance extraction of light emitted from the organic light emitting diode.

14. The organic light emitting diode of claim 13 further comprising a transparent substrate disposed over the outcoupling layer.

15. The organic light emitting diode of claim 13 wherein, if the outcoupling layer is comprising a polymeric material, the polymeric material of the outcoupling layer is an acrylate resin.

16. The organic light emitting diode of claim 13 wherein the length of the nonmetal nanowires ranges from about 1 micrometer to about 20 micrometers, and the diameter of the nanowires ranges from about 50 nanometers to about 200 nanometers.

17. The organic light emitting diode of claim 13 wherein the concentration of the nonmetal nanowires for the outcoupling layer is about 1% to about 10% by weight.

18. The organic light emitting diode of claim 17 wherein the nonmetal nanowires comprise a metal oxide or metal nitride.

19. The organic light emitting diode of claim 18 wherein the nonmetal nanowires comprise a silver alloy.

\* \* \* \* \*